(12) United States Patent
Lee

(10) Patent No.: US 6,788,232 B1
(45) Date of Patent: Sep. 7, 2004

(54) SIGMA DELTA MODULATOR

(75) Inventor: Sang Oh Lee, Cupertino, CA (US)

(73) Assignee: Berkana Wireless, Inc., Campbell, CA (US)

( * ) Notice: Subject to any disclaimer, the term of this patent is extended or adjusted under 35 U.S.C. 154(b) by 0 days.

(21) Appl. No.: 10/345,105

(22) Filed: Jan. 14, 2003

(51) Int. Cl.[7] .............................................. H03M 3/00
(52) U.S. Cl. ........................................ 341/143; 341/155
(58) Field of Search ................................. 341/143, 155

(56) References Cited

U.S. PATENT DOCUMENTS

| | | | |
|---|---|---|---|
| 5,446,460 A | * 8/1995 | Cabler | 341/143 |
| 5,629,701 A | * 5/1997 | Ritoniemi et al. | 341/143 |
| 5,682,161 A | * 10/1997 | Ribner et al. | 341/143 |
| 5,742,246 A | * 4/1998 | Kuo et al. | 341/143 |
| 5,760,722 A | * 6/1998 | Harris et al. | 341/143 |
| 5,936,562 A | * 8/1999 | Brooks et al. | 341/143 |
| 5,949,361 A | * 9/1999 | Fischer et al. | 341/143 |
| 5,982,316 A | * 11/1999 | Shin | 341/143 |
| 6,144,328 A | * 11/2000 | Eastty et al. | 341/143 |
| 6,271,782 B1 | * 8/2001 | Steensgaard-Madsen | 341/143 |
| 6,480,129 B1 | * 11/2002 | Melanson | 341/143 |

OTHER PUBLICATIONS

Abbey, "Multi–band direct sampling receiver", filed on Dec. 19, 1997.*
Brooks et al. "Cascaded sigma–delta pipeline A/D converter with 1.2 MHz signal bandwidth and 89 dB SNR", IEEE Journal of Solid State Circuits, vol. 32, No. 12, Dec. 1997.*
Medeiro et al., "13–bit, 2.2–MS/s, 55–mW multibit cascade Delta sigma modulator in CMOS 0.7 µm single–poly technology", IEEE Journal of Solid State Circuits, vol. 3, No. 6, Jun. 1999.*
Kozak et al., "A novel topologies for time–interleaved Delta–sigma modulators", IEEE Transactions On Circuits and Systems–II: Analog and digital signal processing, vol. 47, No. 7, Jul. 2000.*
Chiang et al., "Cascaded Feedforward Sigma Delta Modulator For Wide Bandwidth Applications", IEEE 2001.*
DeMuer, Bram, et al, "A CMOS Monolithic ΔΣ-Controlled Fractional–N Frequency Synthesizer for DCS–1800", IEEE Journal of Solid–State Circuits, vol. 37, No. 7, Jul. 2002, p. 835–844.
Filiol, Norman M., et al, "An Agile ISM Band Frequency Synthesizer with Built–In GMSK Data Modulation", IEEE Journal of Solid–State Circuits, vol. 33, No. 7, Jul. 1998, p. 998–1008.
Rhee, Woogeun, et al, "A 1.1–GHz CMOS Fracational–N Frequency Synthesizer with a 3–b Third–Order ΔΣ Modulator", IEEE Journal of Solid–State Circuits, vol. 35, No. 10, Oct. 2000, p. 1453–1460.

* cited by examiner

*Primary Examiner*—Jean Bruner Jeanglaude
(74) *Attorney, Agent, or Firm*—Van Pelt & Yi LLP

(57) ABSTRACT

A sigma delta modulator system and a method for modulating a signal are described. The sigma delta modulator includes a plurality of cascading stages, an output coupled to the plurality of the cascading stages via a plurality of feedback connections, and a feedforward connection coupled between a selected one of the plurality of cascading stages and a point closer to the output interface of the sigma delta modulator.

8 Claims, 3 Drawing Sheets

SIGMA DELTA MODULATOR

FIELD OF THE INVENTION

The present invention relates generally to sigma delta modulators. More specifically, a sigma delta modulator with a feedforward connection is disclosed.

BACKGROUND OF THE INVENTION

Modern frequency synthesizers are sometimes implemented with a fractional N phase locked loop (PLL) to achieve more precise tuning of synthesized frequency. Many of these frequency synthesizers use sigma delta modulators (SDM) to produce the desired fractional values used in the circuitry.

FIG. 1 is a block diagram illustrating a frequency synthesizer with a fractional N phase locked loop and a sigma delta modulator. A reference frequency from a stable external source is input into a fractional N PLL 105. PLL 105 generates a voltage that is applied to a voltage controlled oscillator (VCO) 100. VCO 100 generates an output whose frequency depends on the VCO's input voltage, and the output is fed back to PLL 105. The output frequency is divided by a multi-modulus divider 115 and sent to the rest of the PLL circuit. For the purposes of this example, details of the PLL relating to the multi-modulus divider are not shown. Modulus control 120 controls the value of the multi-modulus divider and varies the value over time.

Fractional division controller 110 supplies the values for A and B dividers. Initially, values NA and NB are sent to interface circuit 135. Another value, NK, is sent to SDM 140 to generate a randomized sequence that is used by interface circuit 135 to generate the values for A and B dividers. This sequence determines the rate at which a modulus in the multi-modulus divider is selected, and is proportional to NK. The A and B divider outputs are sent to modulus control 120, which sets the value in multi-modulus divider 115 accordingly. The multi-modulus divider value is in conjunction with the rest of the fractional N PLL circuit (not shown) to generate the desired voltage used by VCO 100 during the locking state. The locking frequency of the frequency synthesizer is related to the values of NA, NB, NK, modulus of multi-modulus divider 115, the reference frequency, and certain constants.

For the PLL to successfully lock with the desired frequency, the SDM should be stable. Also, the sequence generated by the SDM should not contain any spurious frequencies, i.e., the sequence should be as close to truly random as possible and not have any repeat patterns. It would be desirable to improve upon existing SDM designs to achieve good stability and randomization characteristics. Additionally, it would be useful to design the SDM with low in-band noise.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION

It should be appreciated that the present invention can be implemented in numerous ways, including as a process, an apparatus, a system, or a computer readable medium such as a computer readable storage medium or a computer network wherein program instructions are sent over optical or electronic communication links. It should be noted that the order of the steps of disclosed processes may be altered within the scope of the invention.

A detailed description of one or more preferred embodiments of the invention is provided below along with accompanying figures that illustrate by way of example the principles of the invention. While the invention is described in connection with such embodiments, it should be understood that the invention is not limited to any embodiment. On the contrary, the scope of the invention is limited only by the appended claims and the invention encompasses numerous alternatives, modifications and equivalents. For the purpose of example, numerous specific details are set forth in the following description in order to provide a thorough understanding of the present invention. The present invention may be practiced according to the claims without some or all of these specific details. For the purpose of clarity, technical material that is known in the technical fields related to the invention has not been described in detail so that the present invention is not unnecessarily obscured.

An improved sigma delta modulator design is disclosed. The design utilizes a cascaded architecture with one or more feedforward connections. In one embodiment, a feedforward connection results in a stable SDM circuit that produces highly random output sequences and has low out-of-band noise as well as low in-band noise.

Figure 1:
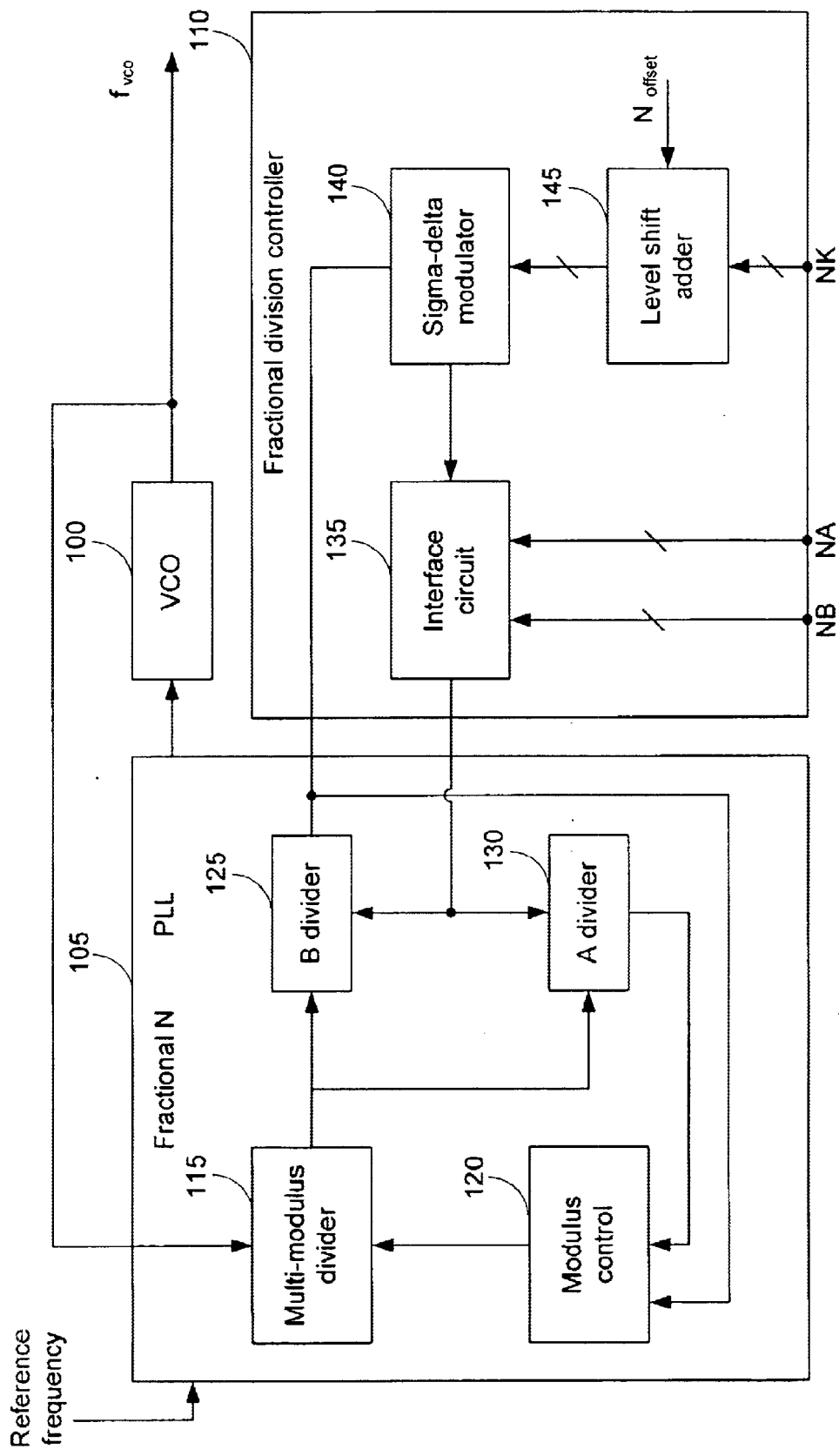
FIG. 1 is a block diagram illustrating a frequency synthesizer with a fractional N phase locked loop and a sigma delta modulator.
Figure 2:
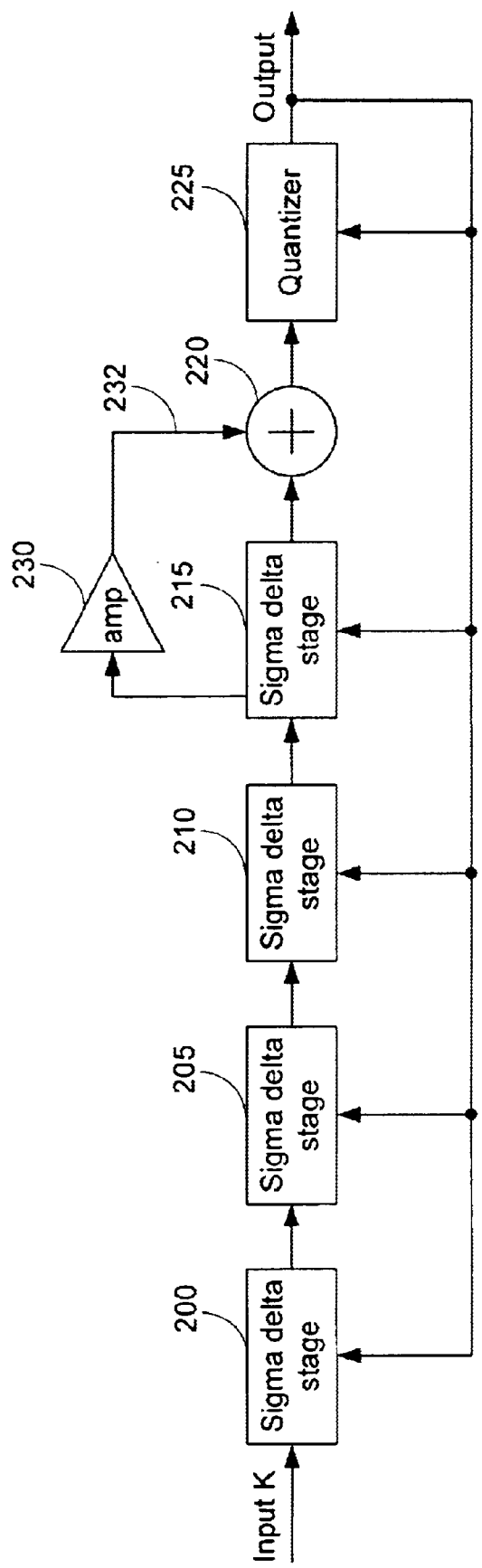
FIG. 2 is a block diagram illustrating one embodiment of a sigma delta modulator design according to the present invention.

FIG. 2 is a block diagram illustrating one embodiment of a sigma delta modulator design according to the present invention. The design includes a feedforward connection coupled between a cascading stage and a point closer to the output of the sigma delta modulator. The embodiment shown is a $4^{th}$ order SDM with four cascading stages. In other embodiments, the order of the SDM, the number of stages and the number of feedforward connection differ depending on the implementation.

The input of the SDM is a digital value, K, and the output of the SDM is a random sequence of ones and zeros statistically distributed at rates proportional to K. Blocks 200, 205, 210 and 215 are the sigma delta stages. First stage 200 receives the input K, as well as a feedback from the output of the SDM. Each of the consecutive stages receives the output from the previous stage and feedback from the output of the SDM, and sends its output to the next stage if available. Stage 215 has an additional output that is amplified by amplifier 230, and the additional output is sent to adder 220. The connection between stage 215 and adder 220 via amplifier 230 is a feedforward connection connecting stage 215 to a point closer to the output interface of the modulator, where the current flows in the direction of arrow 232. Adder 220 adds the signal from the feedforward connection with the output from stage 215. The resulting sum is sent to quantizer 225 to be quantized.

Figure 3:
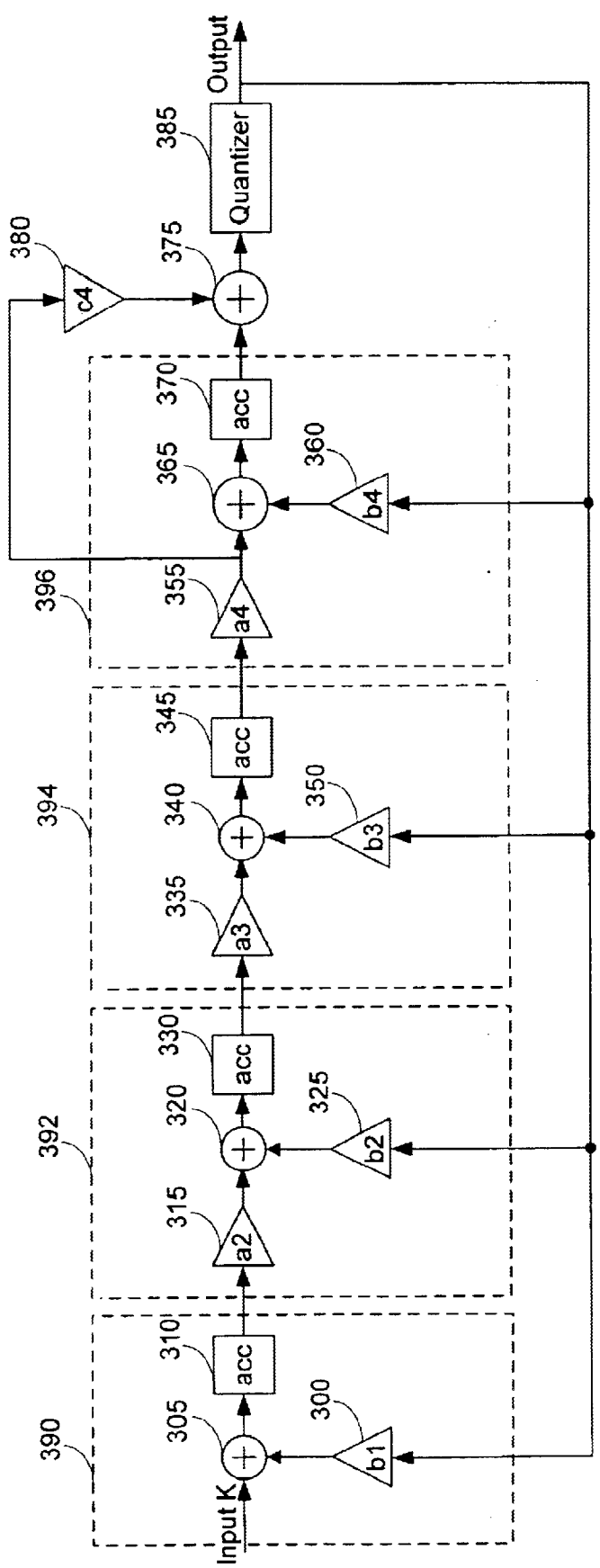
FIG. 3 is a block diagram illustrating details of the sigma delta modulator shown in FIG. 2.

FIG. 3 is a block diagram illustrating details of the sigma delta modulator shown in FIG. 2. Blocks 390, 392, 394 and 396 correspond to the first, second, third and fourth stages. In the first stage, amplifier 300 amplifies the output with a gain of b1 and feeds the amplified output back to adder 305.

Adder 305 sums the amplified output and the input K. The output of the adder is sent to accumulator 310, which accumulates the adder results over time and sends the accumulated value to the next stage.

At the second, third, and fourth stages, amplifiers 315, 335 and 355 receive and amplify the output from the previous stage. The corresponding gains associated with these amplifiers are a2, a3, and a4. The output of the SDM is amplified by amplifiers with gains of b2, b3 and b4, respectively, and is fed back to the adders of each stage. The adders corresponding to these stages, i.e. adders 320, 340 and 365, add the amplified outputs with the output of the previous stage. The results are sent to accumulators 330, 345 and 370. The accumulators accumulate the outputs from the adders over time, and send the accumulated results to the next stage if there is one.

At the fourth stage, the output of amplifier 355 is amplified by another amplifier 380 with a gain of c4. The output from amplifier 380 is fed forward to adder 375 to be summed with the output of accumulator 370. The output of adder 375 is quantized by a one bit quantizer 385, and the result is a randomized sequence of ones and zeros. The rate at which ones appear in the sequence is proportional to the input value.

The feedforward connection in this embodiment adds a zero in the low frequency range of the noise transfer function of the SDM, thereby making it easier to stabilize the SDM circuit and to shape the noise. In the embodiment shown, the noise transfer function of the SDM, H(z), has the following form:

$$H(z)=(1-z^{-1})^4/D(z), \text{ where}$$

$D(z)=1+p_1 z^{-1}+p_2 z^{-2}+p_3 z^{-3}+p_4 z^{-4}$, where $p_1$, $p_2$, $p_3$ and $p_4$ are real number coefficients. In other embodiments, there are more feedforward connections. These feedforward connections connect different parts of the SDM circuit, resulting in different noise transfer functions.

The gain values of the amplifiers are optimized to make the SDM circuit stable. In one embodiment, the following amplifier values are found to be optimal: a2=0.00781, a3=0.125, a4=0.0625, b1=1, b2=0.16242, b3=0.06439, b4=0.03398, c4=1. Values approximate to these are used in some embodiments. Other sets of amplifier gains that result in a stable SDM circuit can be found using methods based on the aforementioned gain values as seeds, including iterative methods based on trial and error or optimization. In embodiments where the number of stages or the configurations of the feedforward connections are different, different sets of gain values apply.

An improved sigma delta modulator design has been disclosed. The design utilizes a cascaded architecture with one or more feedforward connections that add zeros to the noise transfer function, to achieve better stability and randomization characteristics, lower out-of-band noise as well as lower in-band noise.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A sigma delta modulator comprising:

a plurality of cascading stages;

an output interface coupled to the plurality of the cascading stages via a plurality of feedback connections, the output interface generating a modulated output signal corresponding to a randomized bit sequence representing a frequency range of the sigma delta modulator;

a feedforward connection coupled between a selected one of the plurality of cascading stages and a point closer to the output interface of the sigma delta modulator, wherein the feedforward connection adds a zero to the randomized bit sequence in a low frequency range of the sigma delta modulator to stabilize the modulated output signal; and an adder corresponding to each of the cascading stages and producing an output signal by adding an amplified feedback output with a previous stage amplified output.

2. A sigma delta modulator as recited in claim 1 wherein:

the plurality of cascading stages includes a first sigma delta stage, a second sigma delta stage coupled to the output of the first sigma delta stage and having a gain of approximately 0.00781, a third sigma delta stage coupled to the output of the second sigma delta stage having a gain of approximately 0.125, a fourth sigma delta stage coupled to the output of the third sigma delta stage and having a gain of approximately 0.0625;

the plurality of feed back connections includes a first feed back connection connecting to the first sigma delta stage and having a gain of approximately 1, a second feed back connection connecting to the second sigma delta stage and having a gain of approximately 0.16242, a third feed back connection connecting to the third sigma delta stage and having a gain of approximately 0.06439, a fourth feed back connection connecting to the fourth sigma delta stage and having a gain of approximately 0.03398; and the feedforward connection has a gain of approximately 1.

3. A sigma delta modulator as recited in claim 1 wherein the feedback connections and feedforward connection comprise a plurality of amplifiers.

4. A sigma delta modulator as recited in claim 1 wherein the feedback connections and feedforward connection comprise a plurality of amplifiers having gains that are selected to achieve stability.

5. A sigma delta modulator as recited in claim 1 wherein the plurality of cascading stages are sigma delta stages.

6. A sigma delta modulator as recited in claim 1 wherein the plurality of cascading stages includes a first sigma delta stage, a second sigma delta stage coupled to the output of the first sigma delta stage, a third sigma delta stage coupled to the output of the second sigma delta stage and a fourth sigma delta stage coupled to the output of the third sigma delta stage.

7. A sigma delta modulator as recited in claim 1 wherein:

the plurality of cascading stages includes a first sigma delta stage, a second sigma delta stage coupled to the output of the first sigma delta stage, a third sigma delta stage coupled to the output of the second sigma delta stage, a fourth sigma delta stage coupled to the output of the third sigma delta stage;

the plurality of feed back connections includes a first feed back connection coupled between the output interface and the first sigma delta stage, a second feed back connection coupled between the output interface and the second sigma delta stage, a third feed back connection coupled between the output interface and the third sigma delta stage, a fourth feed back connection coupled between the output interface and the fourth sigma delta stage.

8. A method for modulating an input signal to produce a modulated output signal, comprising:

cascading a plurality of stages;

generating the modulated output signal to correspond to a randomized bit sequence representing a frequency range of a sigma delta modulator;

coupling the modulation output to the plurality of stages via a plurality of feedback connections;

feeding forward the modulated output signal over a feedforward connection between a selected one of the plurality of cascading stages and a point closer to an output interface connected to the modulated output, wherein the feedforward connection adds a zero to the randomized bit sequence in a low frequency range of the frequency range of the sigma delta modulator; and adding an amplified feedback output with a previous stage amplified output to produce an output signal.

* * * * *